US012783774B2

(12) United States Patent
Huang et al.

(10) Patent No.: US 12,783,774 B2
(45) Date of Patent: Nov. 3, 2026

(54) BONDED SEMICONDUCTOR DEVICE AND METHOD FOR FORMING THE SAME

(71) Applicant: Taiwan Semiconductor Manufacturing Company, Ltd., Hsin-Chu (TW)

(72) Inventors: Shih-Han Huang, Kaohsiung City (TW); Wen-I Hsu, Tainan City (TW); Shuang-Ji Tsai, Tainan City (TW); Ming-Hsien Yang, Taichung City (TW); Yen-Ting Chiang, Tainan City (TW); Shyh-Fann Ting, Tainan City (TW); Feng-Chi Hung, Hsin-Chu County (TW); Jen-Cheng Liu, Hsin-Chu City (TW); Dun-Nian Yaung, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1184 days.

(21) Appl. No.: 17/536,724

(22) Filed: Nov. 29, 2021

(65) Prior Publication Data

US 2022/0277127 A1 Sep. 1, 2022

Related U.S. Application Data

(60) Provisional application No. 63/154,152, filed on Feb. 26, 2021.

(51) Int. Cl.
*G06F 30/392* (2020.01)
*H10F 39/00* (2025.01)
(Continued)

(52) U.S. Cl.
CPC ...... *G06F 30/392* (2020.01); *H10W 72/0198* (2026.01); *H10F 39/809* (2025.01);
(Continued)

(58) Field of Classification Search
CPC . H01L 2224/80896; H01L 2224/80895; H01L 2224/8013; H01L 2224/06134;
(Continued)

(56) References Cited

U.S. PATENT DOCUMENTS 6,476,506 B1 11/2002 O'Connor et al.
10,037,968 B2 7/2018 Huang et al.
(Continued)

FOREIGN PATENT DOCUMENTS

CN 107256852 A 10/2017
CN 109935568 A 6/2019
(Continued)

*Primary Examiner* — Marc-Anthony Armand
(74) *Attorney, Agent, or Firm* — HAYNES AND BOONE, LLP

(57) ABSTRACT

A method for wafer bonding includes receiving a layout of a bonding layer with an asymmetric pattern, determining whether an asymmetry level of the layout is within a predetermined range by a design rule checker, modifying the layout to reduce the asymmetry level of the layout if the asymmetry level is beyond the predetermined range. The method also includes outputting the layout in a computer-readable format.

20 Claims, 13 Drawing Sheets

(51) Int. Cl.

*H10W 72/00* (2026.01)
*H10W 72/90* (2026.01)
*H10W 80/00* (2026.01)

(52) U.S. Cl.

CPC ...... *H10W 72/926* (2026.01); *H10W 72/9445* (2026.01); *H10W 80/163* (2026.01); *H10W 80/312* (2026.01); *H10W 80/327* (2026.01)

(58) Field of Classification Search

CPC . H01L 2224/06165; H01L 2224/06177; H01L 2224/0612; H01L 2224/06051; H01L 2224/0603; H10F 39/811; H10F 39/80; H10F 39/809; H10F 39/392; H10W 80/00; H10W 80/011; H10W 80/016; H10W 80/102; H10W 80/301; H10W 72/01; H10W 72/07141; H10W 72/07178; H10W 72/936; H10W 72/90; H10W 90/00; H10W 90/20; H10W 99/00; G06F 30/398; H10D 89/10; G03F 7/705; G03F 1/70

See application file for complete search history.

(56) References Cited

U.S. PATENT DOCUMENTS

| | | | | |
|---|---|---|---|---|
| 10,049,901 | B2 | 8/2018 | Liu et al. | |
| 10,497,667 | B2 | 12/2019 | Huang et al. | |
| 10,790,240 | B2 | 9/2020 | Wu et al. | |
| 2010/0320578 | A1 | 12/2010 | Lee et al. | |
| 2014/0007024 | A1 * | 1/2014 | Tsai | G06F 30/39 716/52 |
| 2016/0093599 | A1 | 3/2016 | Nakayama | |
| 2018/0026067 | A1 | 1/2018 | Lee et al. | |
| 2019/0109086 | A1 | 4/2019 | Li et al. | |
| 2019/0147134 | A1 * | 5/2019 | Wang | G06F 30/20 716/52 |

FOREIGN PATENT DOCUMENTS

| | | | |
|---|---|---|---|
| CN | 109994444 | A | 7/2019 |
| CN | 110429074 | A | 11/2019 |
| CN | 110720143 | A | 1/2020 |
| JP | 2010102401 | A | 5/2010 |
| KR | 20090000868 | A | 1/2009 |
| KR | 20200074221 | A | 6/2020 |

* cited by examiner

BONDED SEMICONDUCTOR DEVICE AND METHOD FOR FORMING THE SAME

PRIORITY

This is a non-provisional application of and claims benefit of U.S. Provisional Patent Application Ser. No. 63/154,152, filed Feb. 26, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

With each progression of the semiconductor fabrication process, semiconductor elements in the integrated circuit components have become smaller to allow more components to be fabricated onto the semiconductor substrate. Three-dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by bonding dies over dies on a wafer level. 3DICs provide improved integration density and other advantages, such as faster speeds and higher bandwidth, because of the decreased length of interconnects between the stacked integrated circuit components, for example. However, with each progression of the semiconductor fabrication process, new challenges in bonding integrated circuit components have been uncovered. One such new challenge relates to wafer distortion issue due to unbalance bonding wave paths caused by asymmetric layouts of bonding layers.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
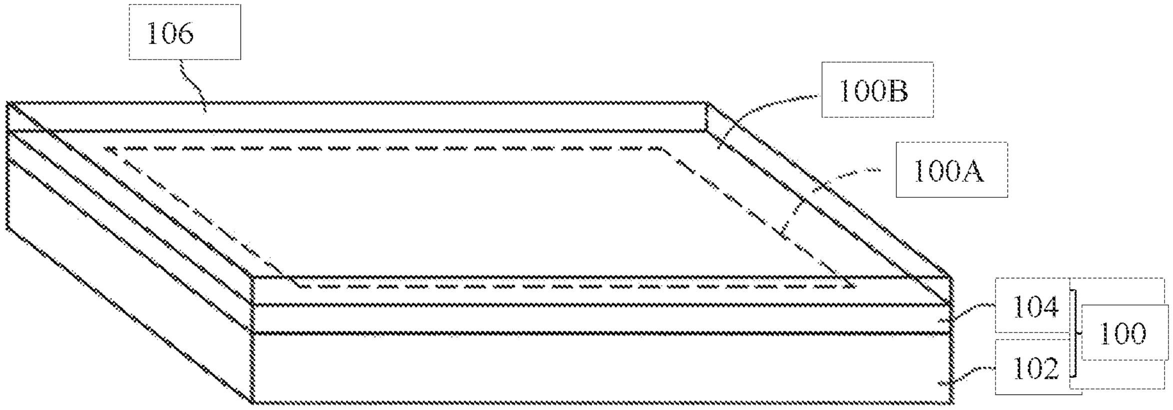
FIGS. 1 and 2 respectively illustrate exemplary integrated circuit components and semiconductor devices including bonded integrated circuit components according to exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
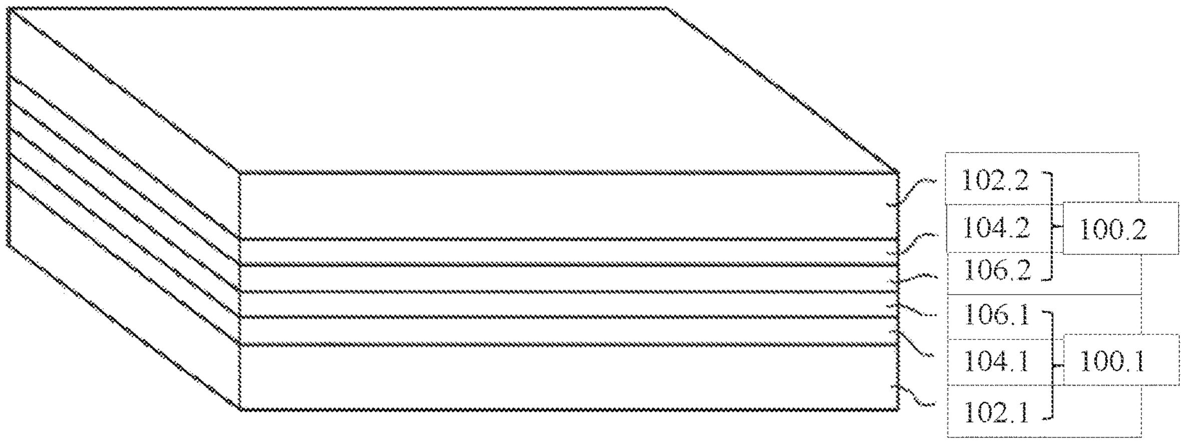

FIGS. 1 and 2 respectively illustrate exemplary integrated circuit component and semiconductor device including bonded integrated circuit components according to exemplary embodiments of the present disclosure. As illustrated in FIG. 1, an exemplary integrated circuit component 100 includes a semiconductor substrate 102 having electronic circuitry formed therein, and an interconnection structure 104 disposed on the semiconductor substrate 102. In some embodiments, the integrated circuit component 100 includes an active region 100A in which the electronic circuitry is formed and a periphery region 100B surrounding the active region 100A. A redistribution layer 106 is fabricated on the interconnection structure 104 of the integrated circuit component 100 in a back-end-of-line (BEOL) process. The redistribution layer 106 formed on the interconnection structure 104 of the integrated circuit component 100 may serve as a bonding layer when the integrated circuit component 100 is bonded with other components. Therefore, the redistribution layer 106 is also referred to as the bonding layer 106. In the exemplary embodiment illustrated in FIG. 1, the electronic circuitry formed in the semiconductor substrate 102 includes analog and/or digital circuitry situated within a semiconductor stack having one or more conductive layers, also referred to as metal layers, interdigitated with one or more non-conductive layers, also referred to as insulation layers. However, one skilled in the relevant art(s) will recognize the electronic circuitry may include one or more mechanical and/or electromechanical devices without departing from the spirit and scope of the present disclosure.

The semiconductor substrate 102 may be made of silicon or other semiconductor materials. Alternatively, the semiconductor substrate 102 may include other elementary semiconductor materials such as germanium. In some embodiments, the semiconductor substrate 102 is made of a compound semiconductor such as sapphire, silicon carbide, gallium arsenic, indium arsenide, or indium phosphide. In some embodiments, the semiconductor substrate 102 is made of an alloy semiconductor such as silicon germanium, silicon germanium carbide, gallium arsenic phosphide, or gallium indium phosphide. In some embodiments, the semiconductor substrate 102 includes an epitaxial layer. For example, the semiconductor substrate 102 has an epitaxial layer overlying a bulk semiconductor.

The semiconductor substrate 102 may further include isolation features (not shown), such as shallow trench isolation (STI) features or local oxidation of silicon (LOCOS) features. Isolation features may define and isolate various semiconductor elements. The semiconductor substrate 102 may further include doped regions (not shown). The doped regions may be doped with p-type dopants, such as boron or $BF_2$, and/or n-type dopants, such as phosphorus (P) or arsenic (As). The doped regions may be formed directly on the semiconductor substrate 102, in a P-well structure, in an N-well structure, or in a dual-well structure.

The electronic circuitry including the above-mentioned isolation features and semiconductor elements (e.g., transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements) may be formed over the semiconductor substrate 102. Various processes may be performed to form the isolation features and semiconductor elements, such as deposition, etching, implantation, photolithography, annealing, and/or other applicable processes. In some embodiments, the electronic circuitry including the isolation features and semiconductor elements are formed in the semiconductor substrate 102 in a front-end-of-line (FEOL) process.

In some embodiments, the interconnection structure 104 includes dielectric layers, conductive vias embedded in the dielectric layers, and conductive wirings formed between the dielectric layers. Different layers of the conductive wirings are electrically connected to one another through the conductive vias. Furthermore, the interconnection structure 104 is electrically connected to the electronic circuitry formed in the semiconductor substrate 102. In some embodiments, at least one seal ring and at least one alignment mark are formed in the interconnection structure 104, with the seal ring and the alignment mark being formed within the periphery region 100B of the integrated circuit component 100. In some instances, the seal ring surrounds the active region 100A of the integrated circuit component 100, and the alignment mark is formed within a region outside of the seal ring. In some embodiments, pluralities of alignment marks are formed around corners of the integrated circuit component 100. The number of the above-mentioned seal ring and alignment mark(s) is not limited in this disclosure.

In the exemplary embodiment illustrated in FIG. 1, the redistribution layer 106 represents a conductive layer (e.g., a metal layer) from among the one or more conductive layers of the semiconductor stack which is utilized for electrically coupling the electronic circuitry to other electrical, mechanical, and/or electromechanical devices. For example, the redistribution layer 106 may be used to electrically couple the electronic circuitry to an integrated circuit package, such as a through-hole package, a surface mount package, a pin grid array package, a flat package, a small outline package, a chip-scale package, and/or a ball grid array to provide some examples.

As another example and as illustrated in FIG. 2, a semiconductor device includes a first integrated circuit component 100.1, a first redistribution layer 106.1, a second integrated circuit component 100.2 and a second redistribution layer 106.2. The first redistribution layer 106.1 and the second redistribution layer 106.2 are between the first integrated circuit component 100.1 and the second integrated circuit component 100.2. An exemplary first integrated circuit component 100.1 includes a first semiconductor substrate 102.1 having first electronic circuitry formed therein, and a first interconnection structure 104.1 disposed on the first semiconductor substrate 102.1. An exemplary second integrated circuit component 100.2 includes a second semiconductor substrate 102.2 having second electronic circuitry formed therein, and a second interconnection structure 104.2 disposed on the semiconductor substrate 102.2. The first redistribution layer 106.1 from among a first semiconductor stack associated with first electronic circuitry may be electrically and/or mechanically coupled to the second redistribution layer 106.2 from among a second semiconductor stack associated with second electronic circuitry to electrically couple the first electronic circuitry and the second electronic circuitry. In this exemplary embodiment, the first redistribution layer 106.1 is configured and arranged to be electrically and/or mechanically coupled to the second redistribution layer 106.2. In an exemplary embodiment, the first redistribution layer 106.1 is bonded to the second redistribution layer 106.2 using hybrid bonding techniques. In this exemplary embodiment, the hybrid bonding techniques utilize a bonding wave to electrically and/or mechanically couple the first redistribution layer 106.1 and the second redistribution layer 106.2. The term "hybrid bonding" derives from a combination of metal-to-metal bond and insulator-to-insulator (or dielectric-to-dielectric) bond during the bonding process. In some instances, the redistribution layers 106.1 and 106.2 include conducive features for a metal-to-metal bond and dielectric features for an insulator-to-insulator bond, and the bonding wave joins dielectric surfaces that also have metal interconnects to be joined together in the same planar bonding interface. Accordingly, the redistribution layers 106.1 and 106.2 may also be referred to as bonding layers 106.1 and 106.2 (or hybrid bonding layers 106.1 and 106.2). As to be described in further detail below, the first redistribution layer 106.1 and the second redistribution layer 106.2 are configured and arranged to increase balance in bonding wave propagation paths (e.g., along the X-direction and the Y-direction) in promoting symmetric bonding wave propagation between the first redistribution layer 106.1 and the second redistribution layer 106.2 during the bonding, which effectively reduces wafer distortion after the bonding. Notably, those killed in the relevant art(s) would recognize the spirit and scope of the present disclosure can also be applied to other well-known bonding techniques, including but not limiting to direct bonding, surface activated bonding, plasma activated bonding, anodic bonding, eutectic bonding, thermo-compression bonding, reactive bonding, and transient liquid phase diffusion bonding.

Figure 3:
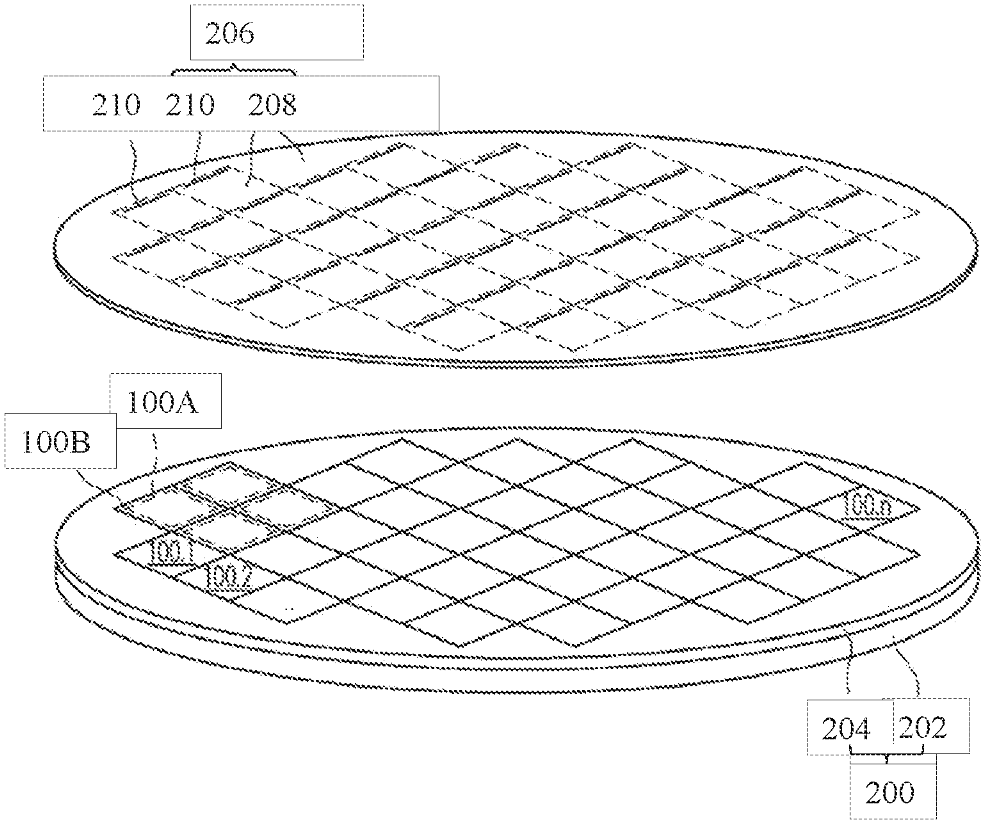
FIGS. 3, 4, and 5 illustrate exemplary semiconductor wafers including the exemplary integrated circuit components according to exemplary embodiments of the present disclosure.
Figure 4:
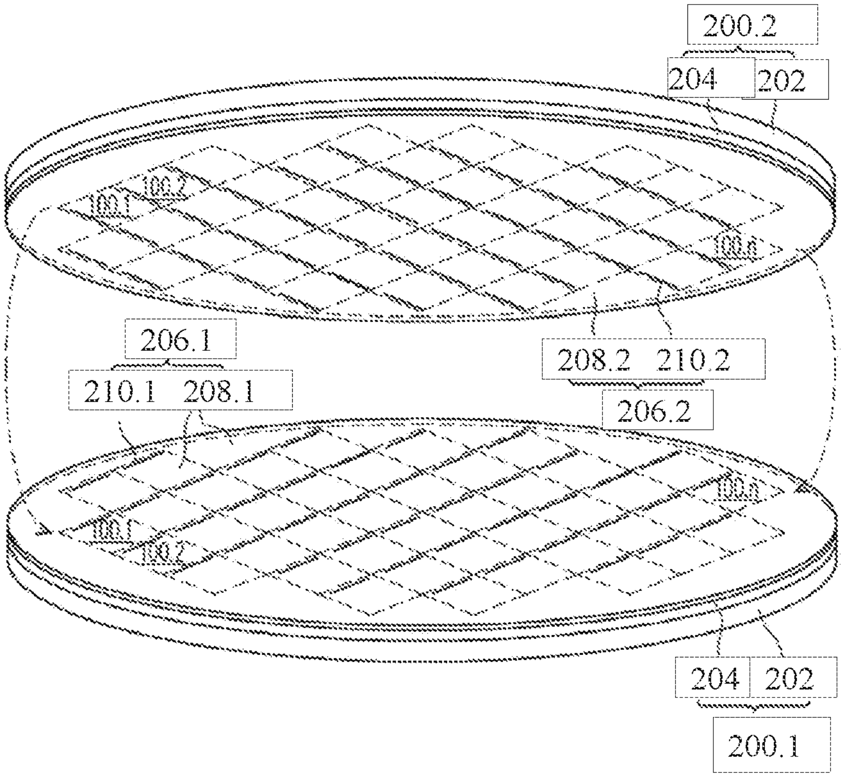
Figure 5:
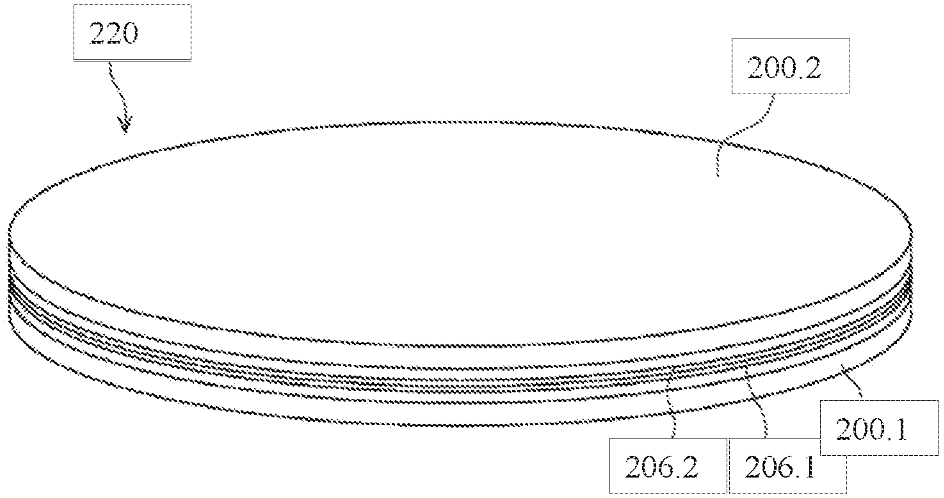

FIGS. 3, 4, and 5 illustrate exemplary semiconductor wafers including the exemplary integrated circuit components according to exemplary embodiments of the present disclosure. Referring to FIG. 3, a semiconductor device fabrication operation is utilized to manufacture multiple integrated circuit components 100.1 through 100.*n* in a semiconductor wafer 200. The semiconductor wafer 200 includes multiple integrated circuit components 100.1 through 100.*n* arranged in array. In some embodiments, the semiconductor wafer 200 includes a semiconductor substrate 202 having electronic circuitry formed therein and an interconnection structure 204 disposed on the semiconductor substrate 202. In some embodiments, each one of the integrated circuit component 100.1 through 100.*n* included in the semiconductor wafer 200 includes an active region 100A having electronic circuitry formed therein and a periphery region 100B surrounding the active region 100A. The semiconductor device fabrication operation uses a predetermined sequence of photographic and chemical processing operations to form the multiple integrated circuit components 100.1 through 100.*n* in the first semiconductor wafer 200.

In the exemplary embodiment illustrated in FIG. 3, the integrated circuit components 100.1 through 100.*n* are formed in and/or on the semiconductor substrate 202 using a first series of fabrication operations, referred to as front-end-of-line processing, and a second series of fabrication operations, referred to as back-end-of-line processing. The front-end-of-line processing represents a series of photographic and chemical processing operations to form corresponding electronic circuitry of the multiple integrated circuit components 100.1 through 100.*n* in and/or on the semiconductor substrate 202. The back-end-of-line processing represents another series of photographic and chemical processing operations to form corresponding interconnection structure 204 of the multiple integrated circuit components 100.1 through 100.*n* on the semiconductor substrate 202 to form the semiconductor wafer 200. In an exemplary embodiment, the integrated circuit components 100.1 through 100.*n* included in the semiconductor wafer 200 may be similar and/or dissimilar to one other.

As shown in FIG. 3, the semiconductor substrate 202 is a portion of the semiconductor wafer 200. The semiconductor substrate 202 may be made of silicon or other semiconductor materials. Additionally, the semiconductor substrate 202 may include other elementary semiconductor materials such as germanium. In some embodiments, the semiconductor substrate 202 is made of a compound semiconductor such as silicon carbide, gallium arsenic, indium arsenide, or indium phosphide. In some embodiments, the semiconductor substrate 202 is made of an alloy semiconductor such as sapphire, silicon germanium, silicon germanium carbide, gallium arsenic phosphide, or gallium indium phosphide. In some embodiments, the semiconductor substrate 202 includes an epitaxial layer. For example, the semiconductor substrate 202 has an epitaxial layer overlying a bulk semiconductor. The semiconductor substrate 202 may further include isolation features (not shown), such as shallow trench isolation (STI) features or local oxidation of silicon (LOCOS) features. Isolation features may define and isolate various semiconductor elements. The semiconductor substrate 202 may further include doped regions (not shown). The doped regions may be doped with p-type dopants, such as boron or $BF_2$, and/or n-type dopants, such as phosphorus (P) or arsenic (As). The doped regions may be formed directly on the semiconductor substrate 202, in a P-well structure, in an N-well structure, or in a dual-well structure.

In some embodiments, the interconnection structure 204 includes dielectric layers, conductive vias embedded in the dielectric layers, and conductive wirings between the dielectric layers, wherein different layers of the conductive wirings are electrically connected to one another through the conductive vias.

A redistribution layer 206 is formed over the semiconductor wafer 200. In some embodiments, the process for fabricating the redistribution layer 206 over the semiconductor wafer 200 includes: forming a dielectric layer over the semiconductor wafer 200; patterning the dielectric layer to form a plurality of openings in the dielectric layer to expose conductive pads of the semiconductor wafer 200; depositing a conductive material over the semiconductor wafer 200 such that the dielectric layer and the conductive pads exposed by the openings in the dielectric layer are covered by the conductive material, wherein the conductive material not only covers the dielectric layer and the conductive pads, but also covers sidewall surfaces of the openings and completely fill the openings; performing a grinding process (e.g., CMP process) to partially remove an excess portion of conductive material until the top surface of the dielectric layer 208 is exposed so as to form arrays of conductive contacts 210 (e.g., metal vias and/or metal pads) in the dielectric layer 208. The redistribution layer 206 including the dielectric layer 208 and the arrays of conductive contacts 210 may serve as a bonding layer when a wafer level bonding process is performed to bond the semiconductor wafer 200 with another wafer.

As illustrated in FIG. 4, a first semiconductor wafer 200.1 and a second semiconductor wafer 200.2 to be bonded with each other are provided. In some embodiments, two different types of wafers 200.1 and 200.2 are provided. In other words, the integrated circuit components 100.1 through 100.*n* included in first semiconductor wafer 200.1 and the integrated circuit components 100.1 through 100.*n* included in second semiconductor wafer 200.2 may have different architectures and perform different functions. For example, the second semiconductor wafer 200.2 is a sensor wafer including a plurality of image sensor chips (e.g., CMOS image sensor chips) and the first semiconductor wafer 200.1 is an application-specific integrated circuit (ASIC) wafer including a plurality of ASIC units corresponding to the image sensor chips. The image sensor chips included in the sensor wafer may be back-side illuminated CMOS image sensors (BSI-CIS) capable of sensing light from the back-surface of the CMOS image sensors, and the redistribution layer 206 may be formed over active surfaces (e.g., surfaces opposite to the back-surface of the CMOS image sensors) of the CMOS image sensors. In some alternative embodiments, two similar or same wafers 200.1 and 200.2 are provided. In other words, the integrated circuit components 100.1 through 100.*n* included in first semiconductor wafer 200.1 and the integrated circuit components 100.1 through 100.*n* included in second semiconductor wafer 200.2 may have the same or similar architecture and perform the same or similar function.

Before bonding the first semiconductor wafer 200.1 and the second semiconductor wafer 200.2, a first redistribution layer 206.1 and a second redistribution layer 206.2 are formed over the first semiconductor wafer 200.1 and the second semiconductor wafer 200.2 respectively. The process for forming the first redistribution layer 204.1 and the second redistribution layer 204.2 may be similar with the process for forming the redistribution layer 206 illustrated in FIG. 3.

In some embodiments, the process for fabricating the first redistribution layer 206.1 over the first semiconductor wafer 200.1 includes: forming a first dielectric layer over the first semiconductor wafer 200.1; patterning the first dielectric layer to form a plurality of first openings in the first dielectric layer 208.1 to expose first conductive pads of the first semiconductor wafer 200.1; depositing a first conductive material over the first semiconductor wafer 200.1 such that the first dielectric layer 208.1 and the first conductive pads exposed by the first openings in the first dielectric layer 208.1 are covered by the first conductive material, wherein the first conductive material not only covers the first dielectric layer 208.1 and the first conductive pads, but also covers sidewall surfaces of the first openings and completely fill the first openings; performing a first grinding process (e.g., CMP process) to partially remove an excess portion of first conductive material until the top surface of the first dielectric layer 208.1 is exposed so as to form multiple arrays of conductive contacts 210.1 (e.g., metal vias and/or metal pads) in the first dielectric layer 208.1. In some embodiments, the process for fabricating the second redistribution layer 206.2 over the second semiconductor wafer 200.1 includes: forming a second dielectric layer 206.2 over the second semiconductor wafer 200.2; patterning the second dielectric layer 208.2 to form a plurality of second openings in the second dielectric layer 208.2 to expose second conductive pads of the second semiconductor wafer 200.2; depositing a second conductive material over the second semiconductor wafer 200.2 such that the second dielectric layer 208.2 and the second conductive pads exposed by the second openings are covered by the second conductive material, wherein the second conductive material not only covers the second dielectric layer 208.2 and the second conductive pads, but also covers sidewall surfaces of the second openings and completely fill the second openings; performing a second grinding process (e.g., CMP process) to partially remove an excess portion of second conductive material until the top surface of the second dielectric layer 208.2 is exposed so as to form multiple arrays of conductive contacts 210.2 (e.g., metal vias and/or metal pads) in the second dielectric layer 208.2.

In some embodiments, the arrays of conductive contacts 210.1 slightly protrude from the top surface of the first dielectric layer 208.1 and the arrays of conductive contacts 210.2 slightly protrude from the top surface of the second dielectric layer 208.2 because the first and dielectric layers 208.1 and 208.2 are polished at a relatively higher polishing rate while the conductive material is polished at a relatively lower polishing rate during the CMP processes.

As illustrated in FIG. 4 and FIG. 5, after the first and second redistribution layers 206.1 and 206.2 are formed over the first and second semiconductor wafers 200.1 and 200.2, the second semiconductor wafer 200.2 having the second redistribution layer 206.2 formed thereon is flipped onto the first redistribution layer 206.1 formed on the first semiconductor wafer 200.1 such that the multiple arrays of conductive contacts 210.1 of the first redistribution layer 206.1 are substantially aligned with the multiple arrays of conductive contacts 210.2 of the second redistribution layer 206.2. Then, the first semiconductor wafer 200.1 is bonded to the second semiconductor wafer 200.2 through the first and second redistribution layers 206.1 and 206.2 to form a semiconductor device 210. In some embodiments, the bonding interface between the first redistribution layer 206.1 and the second redistribution layer 206.2 in the bonded structure (e.g., the semiconductor device) 220 is substantially misalignment free after performing the bonding process. This bonding may include hybrid bonding, direct bonding, surface activated bonding, plasma activated bonding, anodic bonding, eutectic bonding, thermo-compression bonding, reactive bonding, transient liquid phase diffusion bonding and/or any other well-known bonding technique which is apparent to those skilled in the relevant art(s) without departing from the spirit and scope of the present disclosure.

Figure 6:
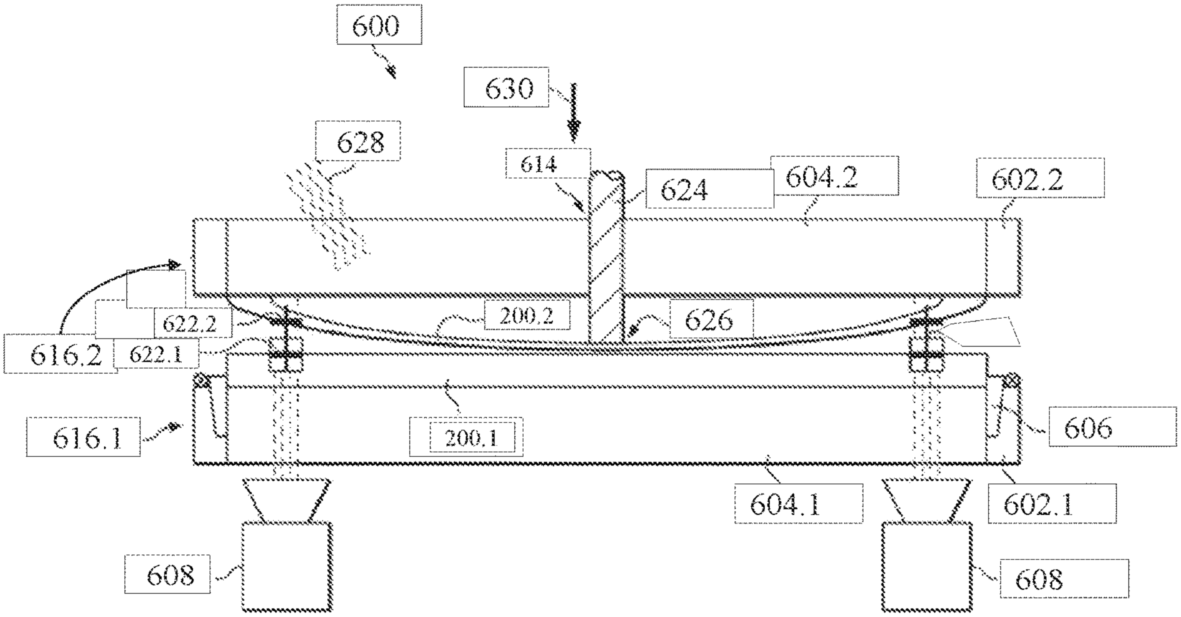
FIG. 6 illustrates a wafer bonding system for bonding wafers by creating a bonding wave according to various aspects of the present disclosure.

Reference is made to FIG. 6. A wafer bonding system 600 is illustrated for bonding semiconductor wafers 200.1 and 200.2. The wafer bonding system 600 includes a first stage 602.1 and a second stage 602.2. A first chuck 604.1 is mounted on or attached to the first stage 602.1, and a second chuck 604.2 is mounted on or attached to the second stage 602.2. The first stage 602.1 and the first chuck 604.1 are also referred to herein collectively as a first support 616.1. The second stage 602.2 and the second chuck 604.2 are also referred to herein collectively as a second support 616.2. The first semiconductor wafer 200.1 is placed on or coupled to a first support 616.1, and the second semiconductor wafer 200.2 is placed on or coupled to a second support 616.2. The first semiconductor wafer 200.1 and the second semiconductor wafer 200.2 may be held onto or retained onto the first support 616.1 and the second support 616.2, respectively, such as, by a vacuum. Other methods or devices may also be used to retain the first semiconductor wafer 200.1 and the second semiconductor wafer 200.2 onto the first support 616.1 and the second support 616.2. The second support 616.2 is inverted and disposed over the first support 616.1. A pin 624 extends through the second chuck 604.2 through an aperture 614.

The first semiconductor wafer 200.1 includes bonding alignment marks 622.1 formed thereon, and the second semiconductor wafer 200.2 includes bonding alignment marks 622.2 formed thereon. The alignment monitor module 608 and the alignment feedback module 606 are electrically connected together by wiring in the wafer bonding system 600, which adjusts the position of the second semiconductor wafer 200.2 relative to the position of the first semiconductor wafer 200.1 to perform an alignment. The second support 616.2 is then lowered towards the first support 616.1 until the second semiconductor wafer 200.2 contacts the first semiconductor wafer 200.1, as shown in FIG. 4. Pressure is then exerted on a substantially central region of the second semiconductor wafer 200.2 using the pin 624 which is lowered through the aperture 614 in the chuck 604.2. A force 630 is exerted on the pin 624, creating pressure against the second semiconductor wafer 200.2 and causing the second semiconductor wafer 200.2 to bend or bow towards the first semiconductor wafer 200.1, as shown by the bowed region 626 of the second semiconductor wafer 200.2. The amount of the bowing in the bowed region 626 is exaggerated—the amount of the bowing may not be visually noticeable in some embodiments. The force 630 against the pin 624 causes pressure to be exerted against the second semiconductor wafer 200.2. The pressure is then exerted against the first semiconductor wafer 200.1 by the second semiconductor wafer 200.1.

In some embodiments where the alignment system also includes a thermal control module, heat 628 is applied while pressure is applied to the second semiconductor wafer 200.2 using the pin 624. Applying the heat 628 comprises controlling a temperature of the first semiconductor wafer 200.1 or the second semiconductor wafer 200.2 to a temperature of about 20° C. to about 25° C. while pressing the second wafer 200.2 against the first wafer 200.1 in some embodiments. Alternatively, other temperatures and tolerances for the temperature control may be used. In other embodiments, a thermal control module is not included in the alignment system and heat 628 is not applied during the bonding process. After a predetermined time period of applying the pressure and also the heat 628 in some embodiments, the heat 628 is removed and the pin 624 is retracted away from the second semiconductor wafer 200.2. The discontinuation of the pressing of the second semiconductor wafer 200.2 against the first semiconductor wafer 200.1 creates a bonding wave propagating from the center of the semiconductor wafers 200.1 and 200.2. In some embodiments, the bonding caused by the bonding wave between the first semiconductor wafer 200.1 and the second semiconductor wafer 200.2 includes simultaneously performed metal-to-metal bonding between conductive contacts (e.g., conductive contacts 210.1 and 210.2 in FIG. 4) as well as dielectric-to-dielectric bonding between dielectric layers (e.g., dielectric layers 208.1 and 208.2 in FIG. 4). For example, the metal-to-metal bonding between conductive contacts includes via-to-via bonding, pad-to-pad bonding and/or via-to-pad bonding. After the bonding wave reaches edges of the semiconductor wafers 200.1 and 200.2, the resulting bonded wafers comprising the first semiconductor wafer 200.1 and the second semiconductor wafer 200.2 are created, as shown in FIG. 5.

Alignment accuracy is important for device performance and scalability. An alignment shift causes overlay inaccuracy between stacking material layers. For example, in the above instance where the first semiconductor wafer 200.1 is an ASIC wafer including a plurality of ASIC units corresponding to the image sensor chips and the second semiconductor wafer 200.2 is a sensor wafer including a plurality of CMOS image sensors, overlay inaccuracy may cause misalignment between sensor pixels and color filters. Such misalignment may lead to poor circuit performance or even circuit defects. Re-work of bonded wafers can be troublesome and time-consuming. However, during the propagation of the bonding wave between the semiconductor wafers 200.1 and 200.2, if the propagation paths (e.g., along the X-direction and Y-direction) are asymmetric, the bonding wave would travel faster in one direction than the other, causing wafer distortion. Such wafer distortion directly causes misalignment, creating uncertainty in alignment accuracy. As to be described in further detail below, the first redistribution layer 206.1 formed over the first semiconductor wafer 200.1 and the second redistribution layer 206.2 formed over the second semiconductor wafer 200.2 are configured and arranged to minimize asymmetric distribution of conductive contacts, as an effort to increase symmetry in bonding wave propagation paths along the X-direction and the Y-direction to effectively increase alignment accuracy.

Figure 7:
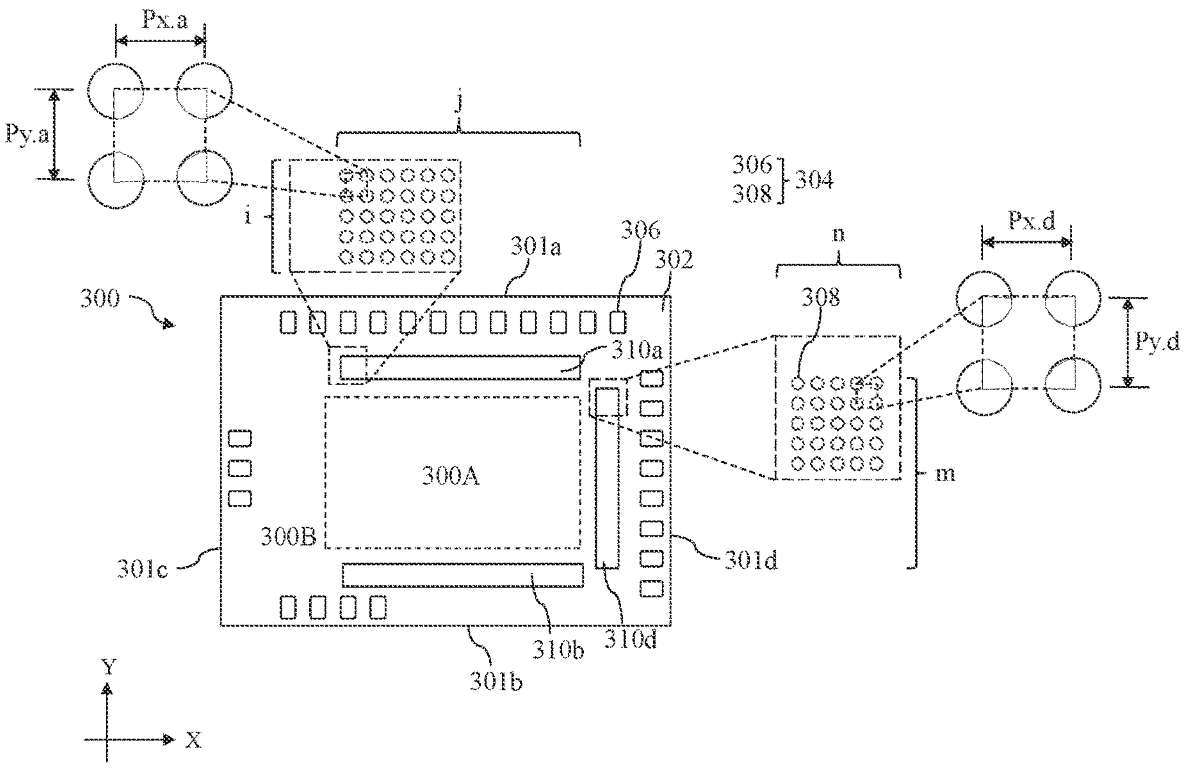
FIG. 7 illustrates an exemplary redistribution layer of the exemplary integrated circuit components according to various aspects of the present disclosure.

FIG. 7 illustrates an exemplary redistribution layer (or referred to as hybrid bonding layer) 300 formed on an integrated circuit component. The redistribution layer 300 may be utilized for electrically coupling the integrated circuit component to other electrical, mechanical, and/or electromechanical devices. In the latter portion of the present disclosure, it will also be referred to as redistribution layer design layout 300. In the exemplary embodiment illustrated in FIG. 7, the redistribution layer 300 includes a center region 300A and a periphery region 300B surrounding the center region 100A. The center region 300A overlaps an active region formed in semiconductor layers underneath (e.g., semiconductor substrate and/or interconnection structure as discussed in association with FIG. 1), in which electronic circuitries are formed, such as a CMOS image sensor pixel array. Inside the periphery region 100B, a top surface of the redistribution layer 300 comprises surfaces of a dielectric layer 302 and a plurality of conductive contacts 304 surrounded by the dielectric layer 302. The conductive contacts 304 may have various forms, such as backside pads 306 and bonding vias 308. The backside pads 306 provides larger surface areas than the bonding vias 308. The dielectric layer 302 and the conductive contacts 304 provide dielectric surface and metal surfaces, respectively, for hybrid bonding with another redistribution layer formed on another wafer (e.g., as depicted in FIG. 4). The conductive contacts 304 may include one or more conductive materials such as tungsten (W), aluminum (Al), copper (Cu), gold (Au), silver (Ag), or platinum (Pt) to provide some examples. However, the conductive contacts 304 may alternatively, or additionally, include other materials, such as silicide, for example, nickel silicide (NiSi), sodium silicide ($Na_2Si$), magnesium silicide ($Mg_2Si$), platinum silicide (PtSi), titanium silicide ($TiSi_2$), tungsten silicide ($WSi_2$), or molybdenum disilicide ($MoSi_2$) to provide some examples, as will be recognize by those skilled in the relevant art(s) without departing from the spirit and scope of the present disclosure.

In the exemplary embodiment illustrated in FIG. 7, the backside pads 306 are disposed and lined up along four edges 301*a-d* of the redistribution layer 300. Each of the backside pad 306 may have a rectangular shape, a rounded-corner rectangular shape, a circular shape, or other suitable shapes. In the illustrated embodiment, each backside pad 306 has a rounded-corner rectangular shape. Along the top edge 301*a* or the bottom edge 301*b*, the backside pads 306 form a line array extending lengthwise along the X-direction of a Cartesian coordinate system, while each backside pad 306 in the line array may extend lengthwise in the Y-direction of the Cartesian coordinate system. Along the left edge 301*c* or the right edge 301*d*, respectively, the backside pads 306 form a line array extending lengthwise along the Y-direction, while each backside pad 306 in the line array may extend lengthwise in the X-direction.

The bonding vias 308 may be grouped into multiple via arrays. In the exemplary embodiment illustrated in FIG. 7, the bonding vias 308 form three via arrays 310*a*, 310*b*, and 310*d*. The via array 310*a* is proximal to the top edge 301*a* and extends lengthwise along the X-direction. The via array 310*b* is proximal to the bottom edge 301*b* and extends lengthwise along the X-direction. The via array 310*d* is proximal to the right edge 301*d* and extends lengthwise along the Y-direction. In the illustrated embodiment, a line array formed by the backside pad 306 is disposed closer to respective edge than the via array. That is, the backside pad 306 is disposed in the outer region of the redistribution layer 300. The via array 310*a* includes bonding vias 308 arranged in i rows and j columns. The pitch along the X-direction Px.a and the pitch along the Y-direction Py.a may each range from about 3 um to about 10 um. In various embodiments, the value of i (number of rows) may range from about 5 to about 100. The via array 310*b* may have the same arrangement of i rows and k columns and the same pitches as the via array 310*a*. Alternatively, the via array 310*b* may have a different arrangement, such as an array of i' rows and k' columns with pitch along the X-direction Px.b and pitch along the Y-direction Py.b. In various embodiments, the value of i' (number of rows) may range from about 5 to about 100. The via array 310*d* includes bonding vias 308 arranged in m rows and n columns. The pitch along the X-direction Px.d and the pitch along the Y-direction Py.d may each range from about 3 um to about 10 um. In various embodiments, the value of n (number of columns) may range from about 5 to about 100. A metal-to-metal bonding density (denoted as PD) is defined as a ratio between areas occupied by bonding vias and total area in a via array. In some embodiments, each bonding via is in a circular shape with a radius r. The via array 310*a* has a metal-to-metal bonding density $PD.a=\pi r^2/(Px.a*Py.a)$, the via array 310*b* has a metal-to-metal bonding density $PD.b=\pi r^2/(Px.b*Py.b)$, and the via array 310*c* has a metal-to-metal bonding density $PD.d=\pi r^2/(Px.d*Py.d)$. In various embodiments, PD may range from about 10% to about 50%. The via array 310*a* and the via array 310*b* may have the same PD value due to the same array arrangement. The via array 310*d* may have a different PD value.

The exemplary embodiment illustrated in FIG. 7 has an asymmetric layout for at least two folds. First, the line arrays formed by the backside pads 306 are asymmetric with respect to imaginary center lines along the X-direction or the Y-direction. The line array proximal to the bottom edge 301*b* has less number of the backside pads 306 than the line array proximal to the top edge 301*a*. The line array proximal to the left edge 301*c* has less number of the backside pads 306 than the line array proximal to the right edge 301*d*. Second, the via arrays are asymmetric with respect to imaginary center line along the Y-direction. There is a via array 310*d* proximal to the right edge 301*d*, but no corresponding via array proximal to the left edge 301*c*. Further, the array arrangements between the via array 310*d* and the via arrays 310*a*/310*b* may be different as well.

When a bonding wave propagates through the semiconductor wafers 200.1 and 200.2 from a wafer center (the bowed region 626 as depicted in FIG. 6) towards wafer edges, it travels through periodically arranged redistribution layers 300. If there are no conductive contacts 304 but dielectric layer 302, the surface of the redistribution layers 300 is homogeneous as one continuous dielectric surface, and the speed of the bonding wave along the X-direction and the Y-direction would be roughly the same. However, the distribution of the conductive contacts 304 introduces discontinuity between dielectric surfaces and metal surfaces, which alters the speed of the bonding wave (bonding wave velocity). Since the exemplary redistribution layer 300 has an asymmetric layout, metal densities along the X-direction and the Y-direction are different and the changes of the speed of the bonding wave are also different along the X-direction and the Y-direction. For example, in the exemplary embodiment illustrated in FIG. 7, the bonding wave along the X-direction travels through one partial line array of backside pads 306 proximal to a center of the edge 301*c*, one via array 310*d*, and one line array of backside pads 306 proximal to the edge of 301*d*. As a comparison, the bonding wave along the Y-direction travels through one partial line array of backside pads 306 offset to a side of the edge 301*b*, two via arrays 310*b*/310*a*, and one line array of backside pads 306 proximal to the edge of 301*a*. The asymmetric distribution of the backside pads 306 and bonding vias 308 causes difference between the speed of the bonding wave along the X-direction and the Y-direction, which in turn leads to wafer distortion and misalignment. As to be described in further detail below, an asymmetric layout of a redistribution layer can be screened and identified and thus altered to become a more symmetric layout through an integrated circuit manufacturing flow in an integrated circuit manufacturing system.

Figure 8:
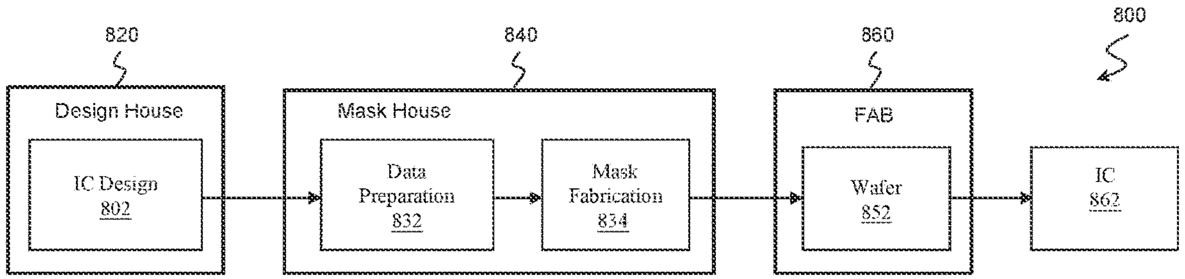
FIG. 8 is a simplified block diagram of an embodiment of an integrated circuit manufacturing system and an associated manufacturing flow.

FIG. 8 is a simplified block diagram of an embodiment of an integrated circuit manufacturing system 800 and an integrated circuit manufacturing flow associated therewith, which may benefit from various aspects of the provided subject matter. The integrated circuit manufacturing system 800 includes a plurality of entities, such as a design house 820, a mask house 840, and an integrated circuit manufacturer 860 (i.e., a fab), that interact with one another in the design, development, and manufacturing cycles and/or services related to manufacturing an integrated circuit device 862. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 820, mask house 840, and integrated circuit manufacturer 860 may be owned by a single larger company, and may even coexist in a common facility and use common resources.

The design house (or design team) 820 generates an IC design layout 802. The integrated circuit design layout 802 includes various geometrical patterns designed for the integrated circuit device 862, particularly a redistribution layer for wafer bonding purpose in the provided subject matter in the present disclosure. An exemplary redistribution layout 802 is shown in FIG. 7. The various geometrical patterns in the redistribution layout 802, such as circles and rectangles (with or without rounded corners), may correspond to patterns of metal that make up various conductive contacts of the redistribution layer to be fabricated. The design house 820 implements a proper design procedure to form the integrated circuit design layout 802 including the layout for the redistribution layer. The design procedure may include logic design, physical design, and/or place and route. The integrated circuit design layout 802 is presented in one or more data files having information of the geometrical patterns. For example, the integrated circuit design layout 802 can be expressed in a GDSII file format, a DFII file format, or another suitable computer-readable data format.

The mask house 840 uses the design layout 802 to manufacture one or more masks to be used for fabricating various layers of the integrated circuit device 862, particularly a layout of a redistribution layer. The mask house 840 performs mask data preparation 832, mask fabrication 834, and other suitable tasks. The mask data preparation 832 translates the redistribution layer design layout into a form that can be physically written by a mask writer. The mask fabrication 834 then fabricates a plurality of masks that are used for patterning a substrate (e.g., a wafer). In the present embodiment, the mask data preparation 832 and mask fabrication 834 are illustrated as separate elements. However, the mask data preparation 832 and mask fabrication 834 can be collectively referred to as mask data preparation.

In the present embodiment, the mask data preparation 832 includes a redistribution layer design layout screening operation (e.g., by checking a design rule, such as a hybrid bonding layer design rule), conductive contact adjustment operation, which inserts dummy conductive contacts and/or relocates some of the conductive contacts so as to improve pattern symmetry to reduce bonding wave velocity variation. This will be described in details later. The mask data preparation 832 may further include optical proximity correction (OPC) which uses lithography enhancement techniques to compensate for image errors, such as those that can arise from diffraction, interference, or other process effects. The mask data preparation 832 may further include a mask rule checker (MRC) that checks the integrated circuit design layout with a set of mask creation rules which may contain certain geometric and connectivity restrictions to ensure sufficient margins, to account for variability in semiconductor manufacturing processes, etc. The mask data preparation 832 may further include lithography process checking (LPC) that simulates processing that will be implemented by the integrated circuit manufacturer 860 to fabricate bonded wafers and further diced into integrated circuit device 862. The processing parameters may include parameters associated with various processes of the integrated circuit manufacturing cycle, parameters associated with tools used for manufacturing the integrated circuit, and/or other aspects of the manufacturing process.

It should be understood that the above description of the mask data preparation 832 has been simplified for the purposes of clarity, and data preparation may include additional features such as a logic operation (LOP) to modify the integrated circuit design layout according to manufacturing rules, particularly a hybrid bonding layer design rule. Additionally, the processes applied to the integrated circuit design layout 802 during data preparation 832 may be executed in a variety of different orders.

After mask data preparation 832 and during mask fabrication 834, a mask or a group of masks are fabricated based on the modified redistribution layer design layout. For example, an electron-beam (e-beam) or a mechanism of multiple e-beams is used to form a pattern on a mask (photomask or reticle) based on the modified redistribution layer design layout. The mask can be formed in various technologies such as a transmissive mask or a reflective mask. In an embodiment, the mask is formed using binary technology, where a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM.

The integrated circuit manufacturer 860, such as a semiconductor foundry, uses the mask (or masks) fabricated by the mask house 840 to fabricate the integrated circuit device 862. The integrated circuit manufacturer 860 is an integrated circuit fabrication business that can include a myriad of manufacturing facilities for the fabrication of a variety of different integrated circuit products. For example, there may be a manufacturing facility for the front end fabrication of a plurality of integrated circuit products (i.e., front-end-of-line (FEOL) fabrication), while a second manufacturing facility may provide the back end fabrication for the interconnection and packaging of the integrated circuit products (i.e., back-end-of-line (BEOL) fabrication), and a third manufacturing facility may provide other services for the foundry business. In the present embodiment, at least two semiconductor wafers are fabricated using the mask (or masks) to form redistribution layer thereon with improved symmetry, respectively. The semiconductor wafers are then bonded together through a wafer bonding system (e.g., the system 600 as depicted in FIG. 6) to create bonded structures (e.g., the bonded structure 220 as depicted in FIG. 5). Other proper operation may include a planarization process (e.g., a CMP process) before the bonding operation to smooth topography of the interfaces of the to-be-bonded wafers so as to facilitate bonding operation.

Figure 9:
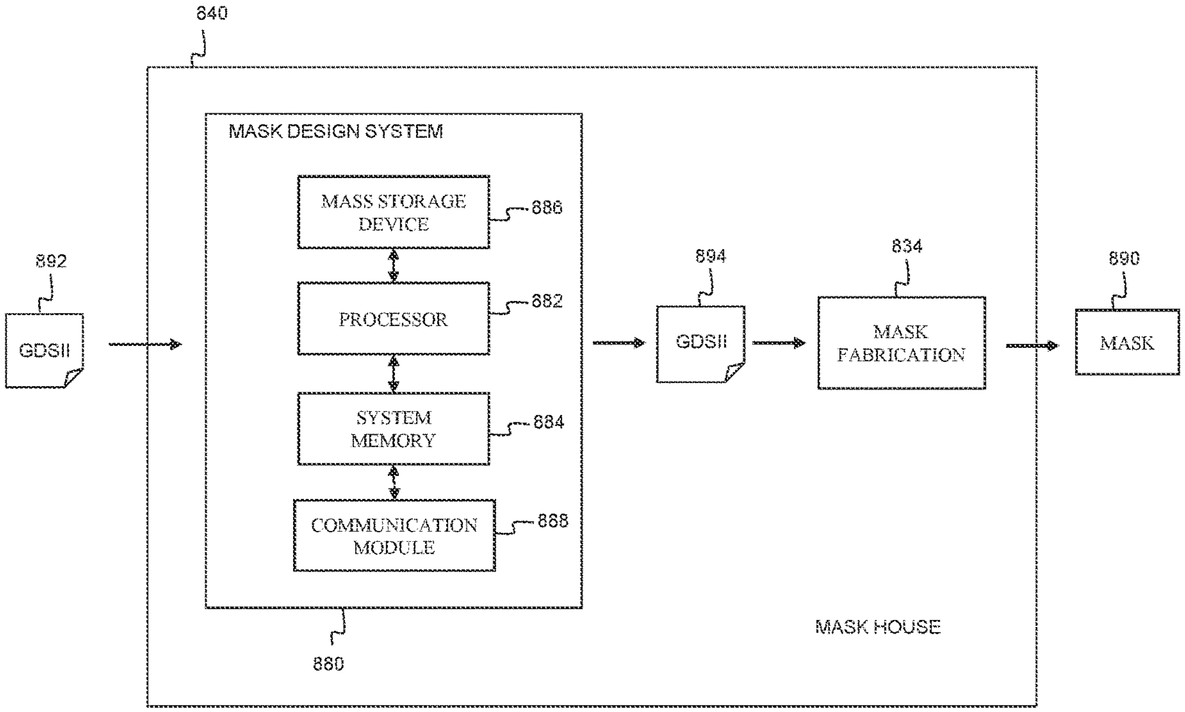
FIG. 9 is a more detailed block diagram of the mask house shown in FIG. 8 according to various aspects of the present disclosure.

FIG. 9 is a more detailed block diagram of the mask house 840 shown in FIG. 8 according to various aspects of the present disclosure. In the illustrated embodiment, the mask house 840 includes a mask design system 880 that is tailored to perform the functionality described in association with mask data preparation 832 of FIG. 8. The mask design system 880 is an information handling system such as a computer, server, workstation, or other suitable device. The system 880 includes a processor 882 that is communicatively coupled to a system memory 884, a mass storage device 886, and a communication module 888. The system memory 884 provides the processor 882 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 886. Examples of mass storage devices may include hard drives, optical drives, magneto-optical drives, solid-state storage devices, and/or a variety of other mass storage devices known in the art. The communication module 888 is operable to communicate information such as integrated circuit design layout files with the other components in the integrated circuit manufacturing system 800, such as the design house 820. Examples of communication modules may include Ethernet cards, 802.11 WiFi devices, cellular data radios, and/or other suitable devices.

In operation, the mask design system 880 is configured to manipulate the redistribution layer design layout before it is transferred to a mask 890 by the mask fabrication 834. In an embodiment, the mask data preparation 832 is implemented as software instructions executing on the mask design system 880. To further this embodiment, the mask design system 880 receives a first GDSII file 892 containing the redistribution layer design layout from the design house 820, and modifies the redistribution layer design layout, for example, to improve layout symmetry by inserting dummy conductive contacts and/or relocating conductive contacts. After the mask data preparation 832 is complete, the mask design system 880 transmits a second GDSII file 894 containing a modified redistribution layer design layout to the mask fabrication 834. In alternative embodiments, the integrated design layout may be transmitted between the components in integrated manufacturing system 800 in alternate file formats such as DFII, CIF, OASIS, or any other suitable file type. Further, the mask design system 880 and the mask house 840 may include additional and/or different components in alternative embodiments.

Figure 10:
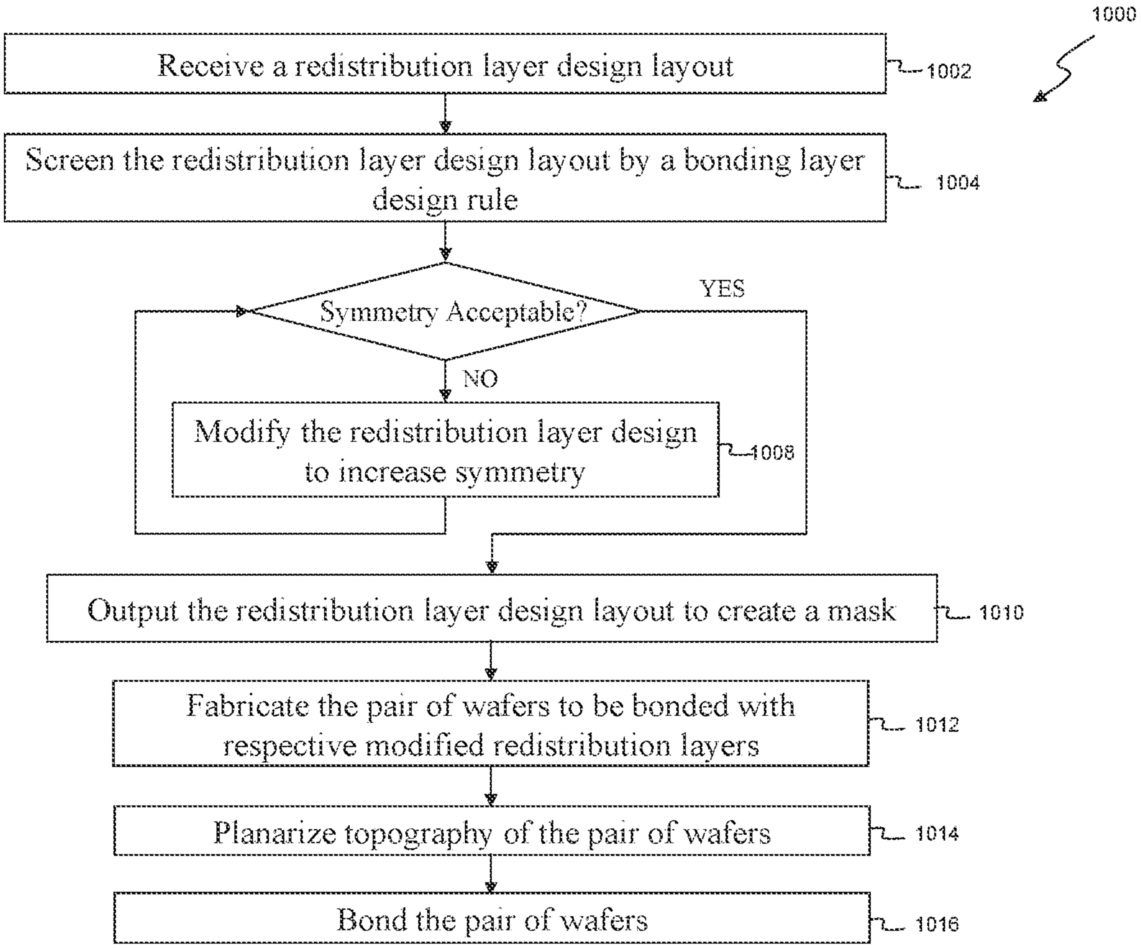
FIG. 10 illustrates a flowchart of a method of modifying a redistribution layer to increase symmetry according to various aspects of the present disclosure.

FIG. 10 is a high-level flowchart of a method 1000 of manufacturing bonded wafers according to various aspects of the present disclosure. In a brief overview, the method 1000 includes operations 1002, 1004, 1008, 1010, 1012, 1014, and 1016. The operation 1002 receives a redistribution layer design layout that may have asymmetric patterns separated by spaces. The operation 1004 screens the redistribution layer design layout based on a specific bonding layer design rule to determine if the layout needs a re-work to improve symmetry. The operation 1008 modifies the redistribution layer design layout by inserting dummy patterns to the spaces, reducing patterns in rows or columns, and/or relocating patterns, so as to increase symmetry. The operation 1010 outputs a redistribution layer design layout for mask fabrication. The operation 1012 fabricates a pair of wafers with redistribution layers using the mask generated from the operation 1010. The operation 1014 planarizes topography of the pair of wafers. The operation 1016 bonds the pair of wafers, for example, by using a wafer bonding system. The method 1000 may be implemented in the various components of the integrated circuit manufacturing system 800. For example, the operations 1002-1008 may be implemented in the mask data preparation 832 of the mask house 840; the operation 1010 may be implemented in the mask fabrication 834 of the mask house 840; and the operation 1012-1016 may be implemented in the integrated circuit manufacturer 860. The method 1000 is merely an example for illustrating various aspects of the provided subject matter. Additional operations can be provided before, during, and after the method 1000, and some operations described can be replaced, eliminated, or moved around for additional embodiments of the method. The method 1000 in FIG. 10 is a high-level overview and details associated with each operation therein will be described in association with FIG. 7 and the subsequent FIGS. 11-13 in the present disclosure.

At operation 1002, the method 1000 receives a redistribution layer design layout, such as the one as shown in FIG. 7. Referring to FIG. 7, the layout 300 includes various geometrical patterns for creating features of a redistribution layer. As discussed above, the layout 300 represents an asymmetric pattern.

At operation 1004, the method 1000 screens the layout 300 using a design rule checker (DRC), particularly using a hybrid bonding layer DRC rule that is specifically designed for checking asymmetry in a hybrid bonding layer. If the layout 300 violates the DRC rule, the DRC will flag a warning or an error so that the design layout may be modified or corrected before proceeding to the next fabrication stage (e.g., the mask fabrication 834). As discussed above, the discontinuity of the dielectric surface due to the distribution of the conductive contacts is the main reason of the bonding wave velocity variation. One way to benchmark the discontinuity is by counting the amount of columns or rows of bonding vias a bonding wave will have to travel through in the X-direction and the Y-direction, respectively, since the velocity impact caused by the via array arrangements is dominant. That is, if the amount of columns of bonding vias a bonding wave will travel through in the X-direction is close to the amount of rows of the bonding vias a bonding wave will travel through in the Y-direction, the velocity variation will be similar in both the X-direction and the Y-direction, which still provides balanced bonding wave paths. In the exemplary layout 300, a bonding wave propagating along the X-direction travels though n columns of bonding vias in the via array 310*d*; the same bonding wave propagating along the Y-direction travels through (i+i') rows of bonding vias in the via arrays 310*a* and 310*b*. If a ratio between the total columns of bonding vias along the X-direction and the total rows of vias along the Y-direction (i.e., n/(i+i')) is beyond a range, the DRC will flag a warning. For an instance, if the ratio is less than about 0.5 or larger than about 1.5, the DRC will flag a warning. If the ratio is less than about 0.5, then there are many more rows of bonding vias the bonding wave has to travel through along the Y-direction, causing large deviation in the velocity along the Y-direction; if the ratio is larger than about 1.5, then there are many more columns of bonding vias the bonding wave has to travel through along the X-direction, causing large deviation in the velocity along the X-direction. On the contrary, if the ratio is within the range from about 0.5 to about 1.5, although it is not perfectly symmetric (unless the ratio equals 1), the DRC can still regard it as an acceptable imbalance between bonding wave paths and give the layout a pass. If the DRC gives a pass, then the method 1000 proceeds to operation 1010 to create a mask. Otherwise, the method 1000 proceeds to operation 1008 to modify the redistribution layer design layout to increase symmetry.

Figure 11:
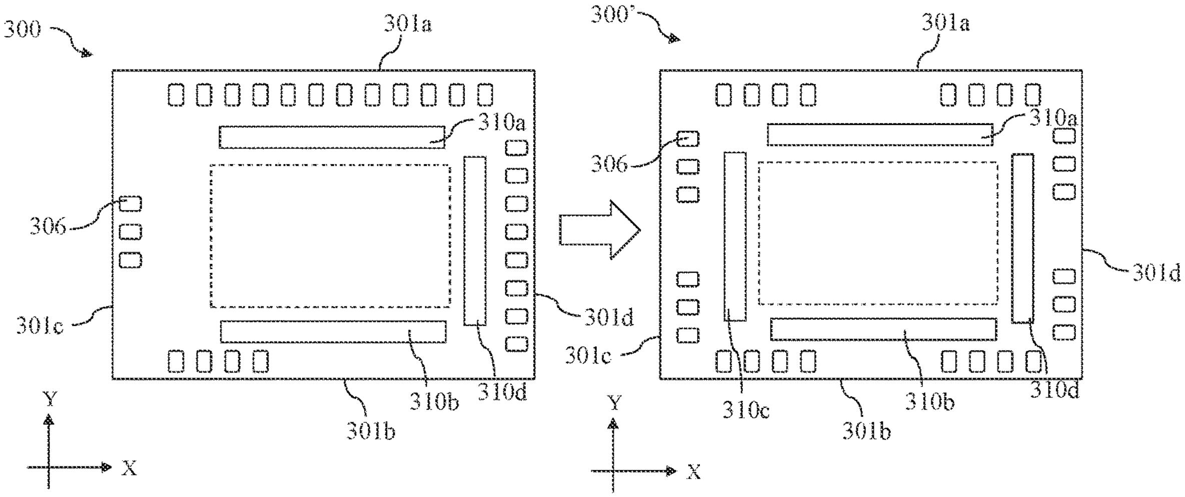
FIGS. 11, 12, and 13 illustrate a redistribution layer design layout modified according to the method shown in FIG. 10 according to various aspects of the present disclosure.
Figure 12:
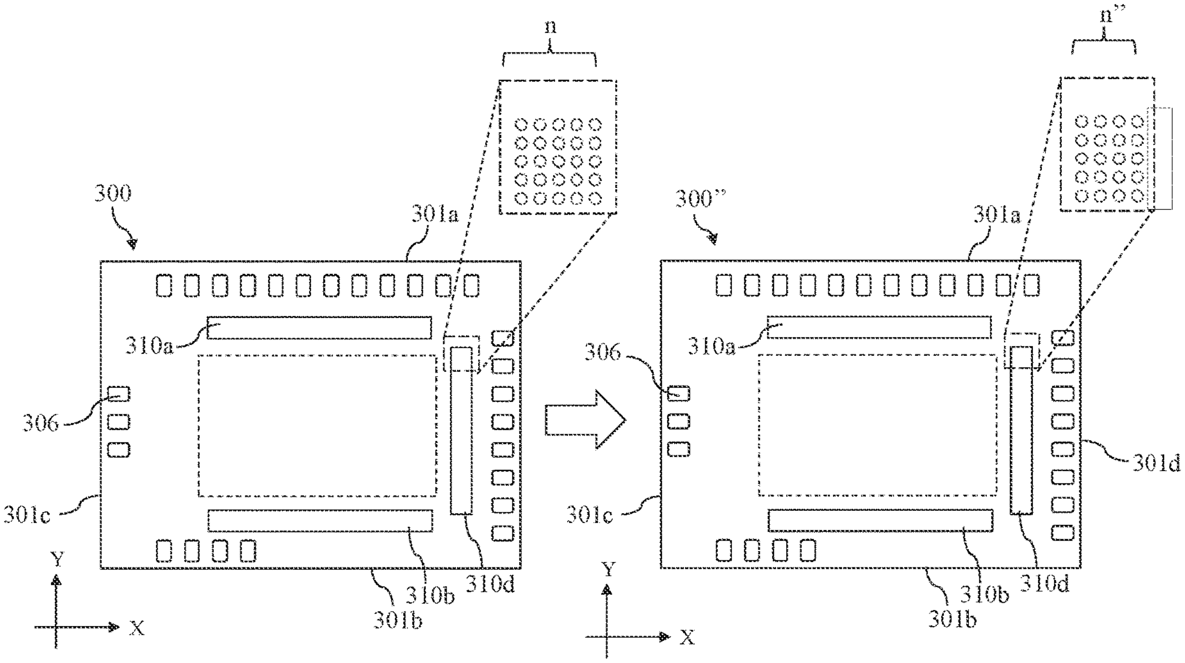
Figure 13:
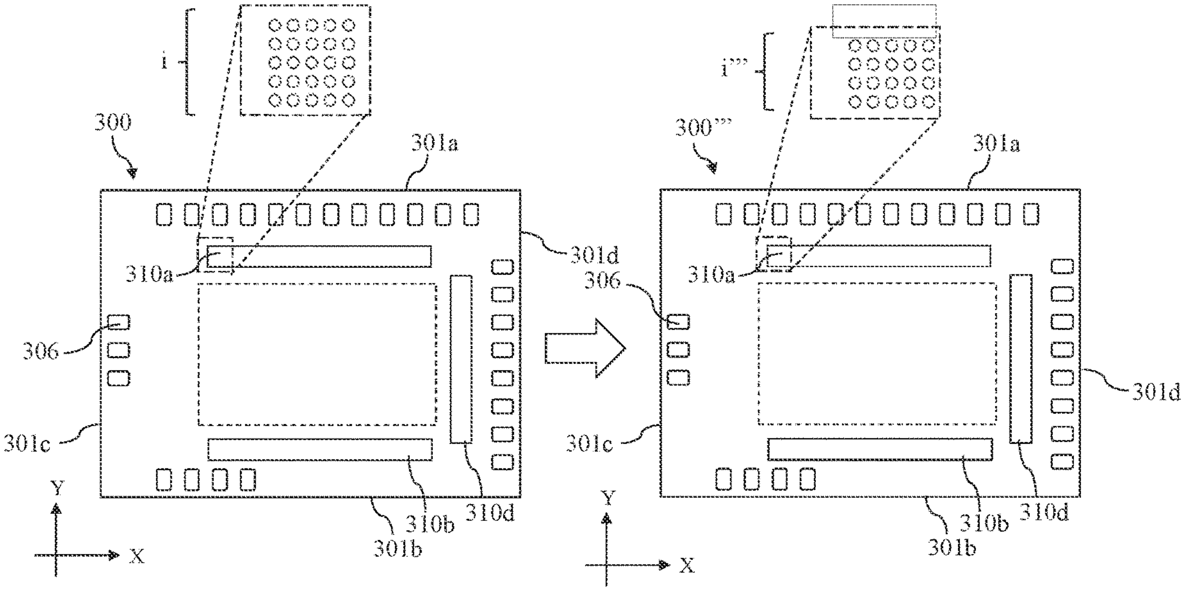

The method 1000 at operation 1008 may take at least three different operations to improve layout symmetry, as represented by FIGS. 11, 12, and 13, respectively. FIGS. 11-13 are merely examples, those killed in the relevant art(s) would recognize the spirit and scope of the present disclosure can also use other techniques to improve layout symmetry, for example, by taking combinations of the three exemplary operations.

FIG. 11 illustrates one way to create a symmetric modified layout. At operation 1008, the method 1000 modifies the redistribution layer design layout 300 to create a modified design layout 300', which improves layout symmetry by inserting dummy via arrays and dummy backside pads, as well as relocating some backside pads to increase layout symmetry. The operation 1008 includes one or more of the following operations. First, a dummy via array 310*c* is added to the empty space proximal to the left edge 301*c*. By adding via array 310*c*, more columns of bonding vias are added for the bonding wave propagating along the X-direction. The via arrays 310*c* and 310*d* may have the same array arrangement. In one instance, the via arrays 310*c* and 310*d* are mirrored images to each other along a Y-axis through the center point of the layout 300'. Second, the via arrays 310*a* and 310*b* may be rearranged to become mirrored images to each other too. In one instance, the number of rows of bonding vias in the vias arrays 310*a* and 310*b* may be different (ii'), and the operation rearrange the vias arrays 310*a* and 310*b* to have equal rows, such as by moving one or more rows of bonding vias from one via array to another, adding one or more dummy rows of bonding vias to the via array having less rows, or by deleting one or more rows of bonding vias from the via array having more rows. Further, the via arrays 310*a*/310*b* and via arrays 310*c*/310*d* may be rearranged to have equal number of rows and columns, respectively. Third, the backside pads 306 may be rearranged to be symmetric in both the X-direction and the Y-direction, such as by adding dummy backside pads to the left edge 306 and the bottom edge 301*b*, relocating some of the backside pads 306 from the right edge 301*d* to other positions of the same edge or to other edges, and/or removing some of the backside pads 306 on the top edge 301*a*. In the illustrated embodiment, four of the backside pads 306 originally located on the right edge 301*d* are relocated to the right side of the bottom edge 301*b*. Also in the illustrated embodiment, a few backside pads 306 originally located in the center of the top edge 301*a* may be removed. Notably, the modified layout 300' does not have to be perfectly symmetric, but to pass the DRC checking. For example, in one instance, without adjusting the backside pads 306, by adding the extra dummy via arrays 310*c* with n' columns, the ratio between the total columns of bonding vias in the X-direction and the total rows of vias in the Y-direction (i.e., (n+n')/(i+i')) in the modified layout 300 may be within the predetermined range (e.g., a range from about 0.5 to about 1.5 as discussed above) and the DRC will give a pass. In various embodiments, n, n', i, i' may have one of the relationships: n=n'=i=i', n=n'≠i=i', and n≠n'≠i≠i'.

FIG. 12 illustrates adjusting number of columns in a vertical via array to create a modified layout that although still asymmetric but meets the ratio requirement specified in the DRC. At operation 1008, the method 1000 modifies the redistribution layer design layout 300 to create a modified design layout 300", which improves bonding wave path balance by modifying columns of bonding vias in a vertical via array. If the ratio between the total columns of bonding vias in the X-direction and the total rows of vias in the Y-direction (i.e., n/(i+i')) in the original layout 300 is beyond the predetermined range (e.g., >1.5), it means the columns in the via array 310*d* are many more than the total rows in the via arrays 310*a* and 310*b* in total. Without further changing the layout, the method 1000 at operation 1008 may reduce columns in the via array 310*d*. By reducing columns in the via array 310*d*, the columns of bonding vias in the via array 310*d* may be reduced from n to n". The total number of bonding vias in the via array 310*d* may be reduced (e.g., by removing electric floating bonding vias) or still remain the same by enlarging the number of rows (i.e., n*m remains a constant). One way to determine the number of columns needed is by using a look-up table. Usually, smaller the metal-to-metal bonding density PD, a larger number of columns is needed. For example, the DRC rule may specify that for the metal-to-metal bonding density PD.d of the via array 310*d*, if PD.d is less than 22%, it needs 12-22 columns; if PD.d is less than 18.5%, it needs no more than 36 columns; if PD.d is from about 12% to about 14%, it needs no more than 64 columns. A look-up table like this may serve as providing an upper boundary to determine maximum columns needed.

The reference is still made to FIG. 12. Since bonding wave velocity distortion along the X-direction is mainly determined by the product of metal-to-metal bonding density and the number of columns the bonding wave travels through, given a fixed bonding via dimensions (e.g., radius of a circular shape) and a pitch along the X-direction (Px.d), the distortion is proportional to number of columns divided by the pitch along the Y-direction (Py.d). A hybrid bonding layer DRC rule may simply specify maximum number of columns needed in a vertical via array should be limited by a product of the pitch along the Y-direction and a constant (A*Py.d). In some instances, the constant A is specified by the DRC, such as a value picked from 5 to 15. In one exemplary DRC rule, the maximum number of columns in the via array 310*d* is limited by 10*Py.d (A=10). For example, if Px.d is about 3 um, and Py.d is about 4.2 um, then the maximum number of columns is 42 (10*4.2). The maximum number of columns calculated from Py.d may further be gated by the look-up table, such that the smaller one of the maximum numbers serves as the upper boundary of the number of columns.

FIG. 13 illustrates adjusting number of rows in horizontal via arrays to create a modified layout that though still asymmetric but meets the ratio requirement specified in the DRC. At operation 1008, the method 1000 modifies the redistribution layer design layout 300 to create a modified design layout 300''', which improves bonding wave path balance by modifying rows of bonding vias in a horizontal via array. If the ratio between the total columns of bonding vias along the X-direction and the total rows of vias along the Y-direction (i.e., n/(i+i')) in the original layout 300 is below the predetermined range (e.g., <0.5), it means the rows in the via arrays 310*a* and 310*b* in total are many more than the columns in the via array 310*d*. Without further changing the layout, the method 1000 at operation 1008 may reduce rows in one or both of the via arrays 310*a* and 310*b*. By reducing total number of rows in the via arrays 310*a* and 310*b*, a number of rows of bonding vias in the via arrays 310*a* may be reduced from i to i'''. The total number of bonding vias in the via arrays 310*a* and 310*b* may be reduced (e.g., by removing electric floating bonding vias), or still remain the same by enlarging the number of columns (i.e., i*j remains a constant). One way to determine the number of rows needed is by using a look-up table. Usually, smaller the metal-to-metal bonding density PD, a larger number of rows is needed. For example, the DRC rule may specify that for the metal-to-metal bonding density PD of the via arrays 310*a* and 310*b*, if PD (PD.a or PD.b) is less than 22%, it needs 12-22 rows; if PD is less than 18.5%, it needs no more than 36 rows; if PD is from about 12% to about 14%, it needs no more than 64 rows. A look-up table like this may serve as providing an upper boundary to determine maximum rows needed.

The reference is still made to FIG. 13. Since bonding wave velocity distortion along the Y-direction is mainly determined by the product of metal-to-metal bonding density and the number of rows the bonding wave travels through, given a fixed bonding via dimensions (e.g., radius of a circular shape) and a pitch along the Y-direction (Py.a), the distortion is proportional to number of rows divided by the pitch along the X-direction (Px.a). A hybrid bonding layer DRC rule may simply specify maximum number of rows needed in a horizontal via array should be limited by a product of the pitch along the X-direction and a constant (B*Px.a). In some instances, the constant B is specified by the DRC, such as a value picked from 5 to 15. In one exemplary DRC rule, the maximum number of total rows in the via arrays 310*a* and 310*b* is limited by 10*Px.a (B=10). For example, if Px.a is about 3 um, and Py.a is about 4.2 um, then the maximum number of rows is 30 (10*3). The maximum number of rows calculated from Px.a may further be gated by the look-up table, such that the smaller one of the maximum numbers serves as the upper boundary of the number of rows.

At the conclusion of operation 1008, the symmetry in the modified redistribution layer design layout is improved and reexamined by the DRC. A re-work may be needed such as in an iterating fashion. Until the DRC gives a pass, the method 1000 proceeds to operation 1010 in creating the mask based on the modified design layout. The modified layout may also include certain assist features, such as those features for imaging effect, processing enhancement, and/or mask identification information. Further, operation 1010 may spin an extra layout for redistribution layer on the other wafer in the pair to be bonded. In embodiments, operation 1010 outputs the modified layout in a computer-readable format for subsequent fabrication stage. For example, the layout may be outputted in GDSII, DFII, CIF, OASIS, or any other suitable file format.

At operation 1012, the method 1000 fabricates the first and second semiconductor wafers. An exemplary operation 1012 uses a sequence of photographic and chemical processing operations to form multiple integrated circuit components, such as the integrated circuit components 100.1 through 100.*n* to provide an example, onto a semiconductor substrate, such as the semiconductor substrate 202 to provide an example, to form the semiconductor wafers. The sequence of photographic and chemical processing operations may include deposition, removal, patterning, and modification. The deposition is an operation used to grow, coat, or otherwise transfer a material onto the semiconductor substrate and may include physical vapor deposition (PVD), chemical vapor deposition (CVD), electrochemical deposition (ECD), and/or molecular beam epitaxy (MBE) to provide some examples. The removal is an operation to remove material from the semiconductor substrate and may include wet etching, dry etching, and/or chemical-mechanical planarization (CMP) to provide some examples. The patterning, often referred to as lithography, is an operation to shape or alter material of the semiconductor substrate to form various geometric shapes of the analog and/or digital circuitry for the electronic device. The modification of electrical properties is an operation to alter physical, electrical, and/or chemical properties of material of the semiconductor substrate, typically, by ion implantation.

At operation 1014, the method 1000 performs a planarization process to smooth surfaces of the semiconductor wafers before proceeding to bonding operation, such as by a chemical mechanical planarization (CMP) process. After the CMP process, the arrays of conductive contacts slightly protrude from the top surface of the dielectric layer of the redistribution layer because the dielectric layer is polished at a relatively higher polishing rate while the conductive material is polished at a relatively lower polishing rate during the CMP processes. It is further observed that the amount of the conductive contacts protruding from the top surface of the dielectric layer varies in the X-direction and the Y-direction. This is because in an asymmetric redistribution layer design layout, the column and row densities are related to the metal ratios which leads to the CMP loading effect and the topography issue. As pattern density increases, the effective contact area between pad and wafer increases and then the effective local pressure becomes lower, resulting in reducing removal rate. In general, the dielectric thickness has a positive relationship with pattern density. During the CMP process, it is observed that the topography of the wafer after certain amount of time of the CMP process is smoother in an early stage of the CMP processing cycle, and the topography of the wafer becomes more uneven as the processing time increases beyond a certain amount of time. This is because, for a given features with higher pattern density a lower polishing rate is shown. Since a smooth interface provides less discontinuity along the bonding wave paths, the bonding wave velocity distortion can be further minimized by an optimized CMP processing time. The inventors of the present disclosure have observed that when the CMP pad life time is less than a certain value, such as 3 hours in a particular example, a smooth topography will be achieved. Therefore, this predetermined time (e.g., $<3$ hours) can be introduced to gate the CMP process duration.

At operation 1016, the method 1000 bonds the first semiconductor wafer and the second semiconductor wafer. Although hybrid bonding is illustrated in the present disclosure, operations 1016 may include direct bonding, surface activated bonding, plasma activated bonding, anodic bonding, eutectic bonding, thermocompression bonding, reactive bonding, transient liquid phase diffusion bonding and/or any other well-known bonding technique which is apparent to those skilled in the relevant art(s) without departing from the spirit and scope of the present disclosure to bond the first semiconductor wafer and the second semiconductor wafer.

Although not intended to be limiting, the present disclosure provides many benefits to the manufacturing of a bonded semiconductor device. For example, by improving symmetry in redistribution layer design layout, embodiments of the present disclosure provide balanced bonding wave prorogation paths. This increases alignment accuracy during bonding process. This also reduces re-work rate and reduces material costs per integrated circuit device.

In one exemplary aspect, the present disclosure is directed to a method. The method includes receiving a layout of a bonding layer, the layout including patterns distributed asymmetrically, determining whether an asymmetry level of the layout is within a predetermined range by a design rule checker, modifying the layout to reduce the asymmetry level of the layout if the asymmetry level is beyond the predetermined range, and outputting the layout in a computer-readable format. In some embodiments, the method further includes manufacturing a mask with the layout. In some embodiments, the method further includes forming the bonding layer on a first wafer using the mask, and bonding the first wafer and a second wafer with the bonding layer therebetween. In some embodiments, the patterns include one or more first via arrays oriented vertically and one or more second via arrays oriented horizontally, and the asymmetry level is indicated by a ratio between a number of columns in total of the one or more first via arrays and a number of rows in total of the one or more second via arrays. In some embodiments, the predetermined range is from about 0.5 to about 1.5. In some embodiments, the modifying of the layout includes adding a dummy via array. In some embodiments, the modifying of the layout includes reducing the number of columns in total of the one or more first via arrays or reducing the number of rows in total of the one or more second via arrays. In some embodiments, the patterns include backside pads formed in line arrays along edges of the layout. In some embodiments, the modifying of the layout includes adding at least one dummy backside pad to one of the line arrays. In some embodiments, the modifying of the layout includes removing at least one backside pad from one of the line arrays.

In another exemplary aspect, the present disclosure is directed to a method. The method includes receiving a layout of a redistribution layer of an integrated circuit, the layout having one or more first via arrays oriented vertically and one or more second via arrays oriented horizontally, calculating a ratio between a number of columns in total of the one or more first via arrays and a number of rows in total of the one or more second via arrays, reducing the number of columns or the number of rows if the ratio is beyond a predetermined range, thereby updating the layout, and forming a redistribution layer mask based on the layout if the ratio is within the predetermined range. In some embodiments, the method further includes forming the redistribution layer based on the redistribution layer mask, and stacking the integrated circuit with another integrated circuit, wherein the redistribution layer is stacked therebetween. In some embodiments, the method further includes repeating the steps of calculating and reducing, until the ratio is within the predetermined range. In some embodiments, the reducing of the number of columns or the number of rows includes reducing the number of columns if the ratio is larger than an upper boundary of the predetermined range, and reducing the number of rows if the ratio is smaller than a lower boundary of the predetermined range. In some embodiments, the upper boundary is about 1.5 and the lower boundary is about 0.5. In some embodiments, the reducing of the number of columns or the number of rows includes reducing the number of columns such that the reduced number of columns is not larger than a product of a predetermined constant and a pitch of the one or more first via arrays, and reducing the number of rows such that the reduced number of rows is not larger than a product of the predetermined constant and a pitch of the one or more second via arrays. In some embodiments, the predetermined constant is in a range from about 5 to about 15.

In another exemplary aspect, the present disclosure is directed to a semiconductor device. The semiconductor device includes a semiconductor substrate, an interconnection structure above the semiconductor substrate, and a redistribution layer above the interconnection structure. The redistribution layer includes bonding vias grouped in arrays extending lengthwise either horizontally or vertically. A ratio of a total number of columns of the arrays extending lengthwise vertically and a total number of rows of the arrays extending lengthwise horizontally is within a range from about 0.5 to about 1.5. In some embodiments, the arrays include two arrays extending lengthwise horizontally and only one array extending lengthwise vertically. In some embodiments, the total number of columns of the arrays extending lengthwise vertically is less than ten times of a pitch of the arrays.

The foregoing outlines features of several embodiments so that those having ordinary skill in the art may better understand the aspects of the present disclosure. Those having ordinary skill in the art should appreciate that they may readily use the present disclosure as a basis for designing or modifying other processes and structures for carrying out the same purposes and/or achieving the same advantages of the embodiments introduced herein. Those having ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving a layout of a bonding layer, wherein the layout includes patterns distributed asymmetrically, wherein the patterns include backside pads formed in line arrays along edges of the layout;

determining whether an asymmetry level of the layout is within a predetermined range by a design rule checker;

modifying the layout to reduce the asymmetry level of the layout if the asymmetry level is beyond the predetermined range; and outputting the layout in a computer-readable format.

2. The method of claim 1, further comprising:

manufacturing a mask with the layout.

3. The method of claim 2, further comprising:

forming the bonding layer on a first wafer using the mask; and bonding the first wafer and a second wafer with the bonding layer therebetween.

4. The method of claim 1, wherein the patterns include one or more first via arrays oriented vertically and one or more second via arrays oriented horizontally, and wherein the asymmetry level is indicated by a ratio between a number of columns in total of the one or more first via arrays and a number of rows in total of the one or more second via arrays.

5. The method of claim 4, wherein the predetermined range is from about 0.5 to about 1.5.

6. The method of claim 4, wherein the modifying of the layout includes adding a dummy via array.

7. The method of claim 4, wherein the modifying of the layout includes reducing the number of columns in total of the one or more first via arrays or reducing the number of rows in total of the one or more second via arrays.

8. The method of claim 1, wherein the modifying of the layout includes adding at least one dummy backside pad to one of the line arrays.

9. The method of claim 1, wherein the modifying of the layout includes removing at least one backside pad from one of the line arrays.

10. A method, comprising:

receiving a layout of a redistribution layer of an integrated circuit, the layout having one or more first via arrays oriented vertically and one or more second via arrays oriented horizontally;

calculating a ratio between a number of columns in total of the one or more first via arrays and a number of rows in total of the one or more second via arrays;

reducing the number of columns or the number of rows if the ratio is beyond a predetermined range, thereby updating the layout; and forming a redistribution layer mask based on the layout if the ratio is within the predetermined range.

11. The method of claim 10, further comprising:

forming the redistribution layer based on the redistribution layer mask; and stacking the integrated circuit with another integrated circuit, wherein the redistribution layer is stacked therebetween.

12. The method of claim 10, further comprising:

repeating the steps of calculating and reducing, until the ratio is within the predetermined range.

13. The method of claim 11, wherein the reducing of the number of columns or the number of rows includes:

reducing the number of columns if the ratio is larger than an upper boundary of the predetermined range; and reducing the number of rows if the ratio is smaller than a lower boundary of the predetermined range.

14. The method of claim 13, wherein the upper boundary is about 1.5 and the lower boundary is about 0.5.

15. The method of claim 10, wherein the reducing of the number of columns or the number of rows includes:

reducing the number of columns such that the reduced number of columns is not larger than a product of a predetermined constant and a pitch of the one or more first via arrays; and reducing the number of rows such that the reduced number of rows is not larger than a product of the predetermined constant and a pitch of the one or more second via arrays.

16. The method of claim 15, wherein the predetermined constant is in a range from about 5 to about 15.

17. A method, comprising:

receiving a layout of a bonding layer of an integrated circuit, the layout having a first row of backside pads arranged along a first edge of the layout and a second row of backside pads arranged along a second edge of the layout, a number of the backside pads in the first row larger than a number of the backside pads in the second row, the first edge opposing the first edge;

determining whether an asymmetry level of the layout is within a predetermined range by a design rule checker;

provided the asymmetry level is beyond the predetermined range, removing a first plurality of the backside pads from the first row and adding a second plurality of the backside pads to the second row; and outputting the layout to manufacture a mask.

18. The method of claim 17, wherein at the outputting of the layout, the backside pads originally in the second row prior to the relocating remain unmoved.

19. The method of claim 17, further including:

relocating a third plurality of the backside pads in the second row.

20. The method of claim 17, wherein the predetermined range is a ratio from about 0.5 to about 1.5.

* * * * *